United States Patent [19]

Arnold, Jr. et al.

[11] Patent Number: 4,978,418

[45] Date of Patent: Dec. 18, 1990

[54] CONTROLLED ION IMPLANT DAMAGE PROFILE FOR ETCHING

[75] Inventors: George W. Arnold, Jr., Tijeras; Carol I. H. Ashby, Edgewood; Paul J. Brannon, Albuquerque, all of N. Mex.

[73] Assignee: The United States of America as represented by the United States Department of Energy, Washington, D.C.

[21] Appl. No.: 233,511

[22] Filed: Aug. 18, 1988

[51] Int. Cl.$^5$ .......................... C23C 22/00; B05D 3/00
[52] U.S. Cl. .................................. 156/628; 156/643; 156/667
[58] Field of Search ............... 156/628, 643, 654, 656, 156/667

[56] References Cited

U.S. PATENT DOCUMENTS

| | | | |
|---|---|---|---|
| 3,808,068 | 4/1974 | Johnson et al. | 156/8 |
| 3,852,134 | 12/1974 | Bean | 252/79.2 |
| 4,094,677 | 6/1978 | Weirauch | 96/36 |
| 4,147,564 | 4/1979 | Magee et al. | 148/1.5 |
| 4,268,347 | 5/1981 | Stephens | 156/628 |
| 4,325,182 | 4/1982 | Tefft et al. | 29/583 |
| 4,416,724 | 11/1983 | Fischer | 156/628 |
| 4,450,041 | 5/1984 | Aklufi | 156/628 |
| 4,514,251 | 4/1985 | van Ommen et al. | 156/628 |
| 4,584,055 | 4/1986 | Kayanuma et al. | 156/628 |
| 4,598,039 | 7/1986 | Fischer et al. | 430/323 |
| 4,634,494 | 1/1987 | Taji et al. | 156/628 |
| 4,652,334 | 3/1987 | Jain et al. | 156/628 |

OTHER PUBLICATIONS

M. Minakata, "Efficient LiNbO3 Balanced Bridge Modulator/Switch with an Ion-Etched Slot", *Applied Physics Letters*, vol. 35, No. 1, Jul. 1, 1979, pp. 40–42.

G. Gotz, et al., "Ion Implanation into LiNbO3", *Nuclear Instruments and Methods*, 209/210, 1983, pp. 1079–1088.

B. Zhang, et al., "C2F6 Reactive Ion-Beam Etching of LiNbO3 and Nb2O5 and Their Application to Optical Waveguides", *Journal of Lightwave Technology*, vol. LT-2, No. 4, Aug. 1984, pp. 528–530.

C. Lee, et al., "CF4 Plasma Etching on LiNbO3", *Applied Physics Letters*, vol. 35, No. 10, Nov. 15, 1979, pp. 756–758.

M. Kawabe, et al., "Ridge Waveguides and Electro-Optical Switches in LiNbO3 Fabricated by Ion-Bombardment-Enhanced Etching", *IEEE Trans. on Circuits and Systems*, vol. CAS-26, No. 12, Dec., 1979, pp. 1109–1112.

*Primary Examiner*—David Simmons
*Assistant Examiner*—Lori-Ann Johnson
*Attorney, Agent, or Firm*—Armand McMillan; James H. Chafin; William R. Moser

[57] ABSTRACT

A process for etching a material such as LiNbO$_3$ by implanting ions having a plurality of different kinetic energies in an area to be etched, and then contacting the ion implanted area with an etchant. The various energies of the ions are selected to produce implant damage substantially uniformly throughout the entire depth of the zone to be etched, thus tailoring the vertical profile of the damaged zone.

8 Claims, No Drawings

CONTROLLED ION IMPLANT DAMAGE PROFILE FOR ETCHING

This invention relates to methods for etching patterns on substrates, and more particularly to methods for etching substrates by implanting ions in patterns on the substrates, and then chemically etching the resulting damaged zones. The Government has rights in this invention pursuant to Contract No. DE-AC04-76DP00789, awarded by the United States Department of Energy to AT&T Technologies, Inc.

BACKGROUND OF THE INVENTION

The formation of a variety of devices such as, for example, waveguides and semiconductors, typically includes one or more steps of etching the surface of a substrate which may be made of inorganic materials, such as, for example, $SiO_2$, garnet and $LiNbO_3$. Conventional etching techniques, such as masking a substrate with a patterned photoresist and then contacting the resulting patterned substrate with a chemical etchant to selectively dissolve material from the area defined by the pattern, present problems in controlling vertical and lateral penetration of the etchant into the substrate.

Some materials, such as for example, $LiNbO_3$, are sufficiently resistant to chemical attack that they present the problem of finding a suitable mask or resist for the substrate which can withstand the chemicals which are used for etching.

In one method of overcoming this problem, the pattern to be etched is bombarded with ions in order to damage the patterned area. The resulting damaged area is etched with chemicals at a significantly greater rate than the remainder of the material. This technique of implanting ions within a material to be etched is disclosed, for example, in Johnson et al U.S. Pat. No. 3,808,068; Tefft et al U.S. Pat. No. 4,325,182; Aklufi U.S. Pat. No. 4,450,041; and, Jain et al U.S. Pat. No. 4,652,334. However, these processes, which use ions having a single incident energy, are capable of producing a sufficient level of damage only within a short distance from the surface.

In another method of providing patterns in chemically resistive material ions are impinged onto the patterned surface to erode material from the substrate; however, the mask used to define the pattern is subjected to the same erosive forces as the substrate material, and the erosion of the mask can diminish the lateral resolution of the desired pattern.

SUMMARY OF THE INVENTION

It is accordingly one object of this invention to provide an improved method of etching a material.

It is another object to provide an improved method for etching a material which is highly resistive to etching solutions.

In accordance with this invention, there is provided a process for etching a pattern on a substrate comprising irradiating the surface of the substrate with ions having a plurality of different ion energies to form the desired pattern, and then contacting the resulting ion-implanted area with an etchant.

The ion-implantation step of this process produces a tailored depth profile of displacement damage which controls the subsequent etching step, and determines both the maximum depth that will be etched in the substrate and the sidewall profile of the etched features. This process can be carried out with an ion fluence which is significantly lower than the ion fluence in prior art ion-milling or reactive-ion-etching techniques, thereby minimizing the problems of erosion of masks and loss of lateral resolution. For example, typical ion-milling etch rates of 50 nm per minute with an ion current density of 1 $mA/cm^2$ require a total ion fluence of $3 \times 10^{18}$ ions/$cm^2$ to remove 500 nm of material as compared to as little as $5 \times 10^{15}$ ions/$cm^2$ with the present process. This lower ion fluence reduces or eliminates significant erosion of mask material.

The maximum depth of etching is determined by the range of the most energetic ions rather than by the time of exposure to an etching solution, which greatly reduces the care needed to achieve precise control of etching depth during the etching process. The use of multiple ion energies permits etching to greater depths with a lower ion fluence than is possible with a single ion energy.

This process is especially useful for etching $LiNbO_3$ because of the low chemical reactivity of this compound, and the invention will be illustrated in more detail by describing steps in which $LiNbO_3$ is the material to be etched. It will be recognized by workers in the art that other materials can be treated in a similar manner by implanting ions in a plurality of ion energies.

The ions which are to be implanted within a body of $LiNbO_3$ may be ions which are conventionally used in reactive-ion-etching techniques, such as for example, helium ions.

The maximum ion energy level to be used is determined by the depth to be etched, greater depths requiring higher ion energies. A typically optically useful etching depth of 500 nm for $LiNbO_3$ corresponds to an expected penetration of 150 keV ions.

The number of kinetic energies of the ions impinging on the substrate surface must be at least two and preferably at least three. An increase in the number of ion energies increases the uniformity of the profile of implant damage.

In the preferred method of carrying out the invention, the ion fluence is approximately the same at each energy level in order to produce substantially uniform damage throughout the depth to be etched. As used herein, the term "ion fluence" refers to the total number of ions impinging on a unit area.

Typically, ion energies for etching $LiNbO_3$ to a depth of about 500 nm are about 30, 60, 90, 120 and 150 keV in five steps. The ion fluence in each step may range from about $1 \times 10^{15}$ ions/$cm^2$, or less to $1 \times 10^{16}$ ions/$cm^2$ or more.

Having thus described the invention, the following examples are offered to illustrate it in more detail.

EXAMPLE I

A body of $LiNbO_3$ was implanted with helium ions to an ion fluence of $2 \times 10^{16}$ ions/$cm^2$ at each of three energy levels of 50, 100 and 150 keV. The material was subsequently etched at room temperature by a 24% aqueous solution of HF. An etched depth of 500 nm, which corresponds to the expected range of the 150 keV ions, was reached in less than 9 minutes.

EXAMPLE II

A body of $LiNbO_3$ was implanted with helium ions at a fluence of $2.7 \times 10^{15}$ ions/$cm^2$ at a 30 keV and a fluence of $1 \times 10^{15}$ ions/$cm^2$ at each of the four energies of 60, 90, 120 and 150 keV. The resulting implanted surfaces were etched to a depth of 500 nm in 120 minutes, using 49% HF in water at room temperature.

The foregoing Examples are offered to illustrate the invention and are not intended to limit the scope of the invention. For example, it is obvious that changes may be made in the material to be etched, the ions to be implanted, the ion energies, the number of different ion energies which may be used, and the ion fluence for each ion energy.

What is claimed is:

1. A process for etching a pattern on the surface of a substrate, comprising:
   irradiating said substrate stepwise in said pattern with ions having a plurality of ion energies to provide substantially uniform damage to said material throughout the depth of the ion-implanted material; and, after the irradiating is completed,
   contacting the ion-implanted substrate with an etchant for etching said pattern.

2. A process in accordance with claim 1 wherein said substrate to be etched comprises an electro-optic material.

3. A process in accordance with claim 1 wherein said substrate is $LiNbO_3$.

4. A process in accordance with claim 1 wherein said ions are implanted in a plurality of steps and wherein said ions incident on said surface have average energy levels which are different from each other in at least two of said steps.

5. A process in accordance with claim 4 wherein in at least one of said steps the ions incident on said surface have an energy level which is at least twice the energy level of ions incident on said surface in another of said steps.

6. A process in accordance with claim 4 wherein the average energy level of the ions in the step having the highest energy level ions is from about 2 to about 6 times the average energy level of the ions in the step having the lowest energy level ions.

7. A process in accordance with claim 4 wherein there are at least three steps wherein the average ion energies of the ions are different from each other.

8. A process for etching a $LiNbO_3$ substrate, comprising the steps of irradiating stepwise an area on said substrate to be etched with ions having several different energies, and then, after the irradiating is completed, contacting the irradiated area with an etching solution.

* * * * *